United States Patent

Dierickx et al.

[11] Patent Number: 6,011,251
[45] Date of Patent: Jan. 4, 2000

[54] METHOD FOR OBTAINING A HIGH DYNAMIC RANGE READ-OUT SIGNAL OF A CMOS-BASED PIXEL STRUCTURE AND SUCH CMOS-BASED PIXEL STRUCTURE

[75] Inventors: Bart Dierickx, Mortsel, Belgium; Danny Scheffer, DG Clinge, Netherlands

[73] Assignee: IMEC, Leuven, Belgium

[21] Appl. No.: 09/021,011

[22] Filed: Feb. 9, 1998

[30] Foreign Application Priority Data

Jun. 4, 1997 [GB] United Kingdom ............ 97870084
Oct. 24, 1997 [GB] United Kingdom ............ 97870169

[51] Int. Cl.$^7$ ........................................ H01J 40/14
[52] U.S. Cl. .......................... 250/208.1; 250/214 R; 348/297
[58] Field of Search ............... 250/214.1, 208.1, 250/214 R; 257/288, 290–292, 443, 444; 348/294, 297, 298, 300, 308, 311; 358/482, 483; 377/60–63

[56] References Cited

U.S. PATENT DOCUMENTS

| | | |
|---|---|---|
| 4,473,836 | 9/1984 | Chamberlain . |
| 4,565,756 | 1/1986 | Needs . |
| 4,580,103 | 4/1986 | Tompsett . |
| 4,647,975 | 3/1987 | Alston et al. . |
| 4,703,169 | 10/1987 | Arita ........................... 250/214 R |
| 5,146,074 | 9/1992 | Kawahara et al. . |
| 5,153,420 | 10/1992 | Hack et al. . |
| 5,164,832 | 11/1992 | Halvis et al. . |
| 5,258,845 | 11/1993 | Kyuma et al. . |
| 5,296,696 | 3/1994 | Uno . |
| 5,321,528 | 6/1994 | Nakamura . |
| 5,329,112 | 7/1994 | Mihara .......................... 250/208.1 |
| 5,335,008 | 8/1994 | Hamasaki . |
| 5,608,204 | 3/1997 | Hofflinger et al. . |
| 5,614,744 | 3/1997 | Merrill . |
| 5,841,126 | 11/1998 | Fossum . |
| 5,861,621 | 1/1999 | Takebe et al. ..................... 348/297 |

FOREIGN PATENT DOCUMENTS

| | | |
|---|---|---|
| 548 987 | 6/1993 | European Pat. Off. . |
| 657 863 | 6/1995 | European Pat. Off. . |
| 739 039 | 10/1996 | European Pat. Off. . |
| 2324651 | 10/1998 | United Kingdom . |
| 93/19489 | 9/1993 | WIPO . |

OTHER PUBLICATIONS

Aoki et al., "A Collinear 3–Chip Image Sensor", IEEE International Solid–State Circuits Conference, 1985, pp. 102–103.

(List continued on next page.)

*Primary Examiner*—Stephone Allen
*Attorney, Agent, or Firm*—Knobbe, Martens, Olson & Bear LLP

[57] ABSTRACT

A method is disclosed for obtaining a read-out signal of a MOS-based pixel structure having at least a photosensitive element with an output node and a memory element with a first switch therebetween. The method comprises the steps of while acquiring charge carriers on said output node of said photosensitive element, said charge carriers being converted from electromagnetic radiation on the photosensitive element, after a first time period creating a first signal, and after a second time period, creating a second signal, said read-out signal being a combination of at least said first and said second signals.

According to the present invention, there is no limitation to the amount of collected charges in none of the integrated periods. The signal collected during the first period is memorized by a switch which shortly opens and closes between the period. The switch is thus in the same state in both period of time. After a second period, there are thus two charge packets, each obtained during a different time. In order to read-out, these two charge packets are then combined into one reading. This combination is known either by adding or subtracting this charge packets, e.g., by adding or subtracting them in the circuitry external to the sensor.

36 Claims, 4 Drawing Sheets

OTHER PUBLICATIONS

Horii et al., "A 490×404 Element Imager for a Single–Chip Color Camera", IEEE International Solid–State Circuits Conference, 1985, pp. 96–97.

Nagakawa et al., "A 580×500–Element CCD Imager with a Shallow Flat P Well", IEEE International Solid–State Circuits Conference, 1985, pp. 98–99.

Mahowald, M.A., "Silicon Retina with Adaptive Photoreceptors", *SPIE,* vol. 1473, 1991, pp. 52–58.

Mann, J. "Implementing Early Visual Processing In Analog VLSI: Light Adaptation", *SPIE,* vol. 1473, 1991, pp. 128–136.

Ono et al., "Analysis of Smear Noise In Interline–CCD Image Sensor with Gate–Free Isolation Structure", Abstract of the 1991 Int'l Conference on Solid State Devices and Materials, Yokohama, 1991, pp. 68–70.

Yadid–Pecht et al., "A Random Access Photodiode Array for Intelligent Image Capture", *IEEE Transactions on Electron Devices,* vol. 38, No. 8 Aug. 1991.

Ricquier et al., "Pixel Structure with Logarithmic Response for Intelligent and Flexible Imager Architectures" *Microelectronic Engineering,* 19 (1992), pp. 631–634.

Sevenhans, et al., "A 400mm Long Linear X–Ray Sensitive Image Sensor", IEEE International Solid–State Circuits Conference, 1987, pp. 108–109.

Anderson, S. et al., "A Single Chip Sensor & Image Processor or Fingerprint Verification", IEEE 1991 Custom Integrated Circuits Conference, May 12–15, 1991, pp. 12.1.1–12.1.4.

Dierickx, Bart, "XYW Detector: A Smart Two–Dimensional Particle Sensor", *Nuclear Instruments and Mthods in Physics Research A275,* North–Holland Physics Publishing Division, 1989, pp. 542–544.

Klein, P., "Design and Performance of Semiconductor Detectors with Integrated Amplification and Charge Storage Capability", *Nuclear Instruments and Methods in Physics Research A305,* 1991, pp. 517–526.

Aw, Chye Huat, et al., "A 128×128–Pixel Standard–CMOS Image Sensor with Electronic Shutter", *IEEE Journal of Solid State Circuits,* vol. 31, No. 12, Dec. 1996, pp. 1922–1930.

Martin, W.J. et al., "Dynamic Offset Null", *IBM Technical Disclosure Bulletin,* No. 23, No. 9, Feb. 1981, pp. 4195–4196.

++ or

++

METHOD FOR OBTAINING A HIGH DYNAMIC RANGE READ-OUT SIGNAL OF A CMOS-BASED PIXEL STRUCTURE AND SUCH CMOS-BASED PIXEL STRUCTURE

FIELD OF THE INVENTION

The present invention relates to solid state imaging devices being manufactured in a CMOS- or MOS-technology. More particularly, the present invention is related to a method of obtaining a read-out signal of a CMOS-based pixel structure with a large dynamic range. The present invention is also related to a new pixel structure and to imaging devices having such pixel structure involved in the method of the present invention.

BACKGROUND OF THE INVENTION AND PROBLEM DEFINITION

Solid state imaging devices are well known. These devices find a widespread use in camera systems. In such application, a matrix of pixels comprising light sensitive elements constitutes an image sensor, which is mounted in the camera system. The signal of said matrix is measured and multiplexed to a video-signal.

Commonly solid state image devices are implemented in a CCD-technology or in a CMOS- or MOS-technology.

Among the image sensors implemented in a CMOS- or MOS-technology, CMOS or MOS image sensors with passive pixels and CMOS or MOS image sensors with active pixels are distinguished. An active pixel is configured with means integrated in the pixel to amplify the charge that is collected on the light sensitive element. Passive pixels do not have said means and require a charge-sensitive amplifier that is not integrated in the pixel and is connected with a long line towards the pixel.

There is an ongoing effort to increase the performance of CMOS or MOS image sensors such that a comparable image quality is obtained as the one obtained with high end CCD imagers. Due to the miniaturization of the technology of CMOS based electronic circuits, it is further possible to realize complex CMOS- or MOS-based pixels as small as CCD-based pixels. It is a main advantage of CMOS- or MOS-based image sensors that CMOS technology is being offered by most foundries whereas CCD-technology is rarely offered and a more complex and expensive technology option.

In the co-pending patent applications EP-A-0773667 and EP-97870084.7 pixel structures and methods of addressing them are described which yield, alone or in combination, the above-mentioned goals. The contents of these patent applications are incorporated herein by reference.

In general, it must be recognized that for an imaging device, three specifications that are difficult to match are to be met:

the sensitivity of the image device, especially in the dark,
the cosmetic quality of the image (this means that the image should be flawless), and
the requirement of a response with a high dynamic range.

Image sensors having a nonlinear response such as a logarithmic response are known from, e.g., EP-A-0739039.

However, most of the image sensors with passive or active pixels show a linear voltage-to-light response. This means that their dynamic range is limited by the dynamic range of the linear response. For instance, if the linear output voltage has an S/R ratio of about 250 (which is a typical value) the corresponding dynamic range will be the same.

Image sensors with a double linear response or multiple linear response are known. In such sensors, two or more linear pieces of optical response are combined in one electrical output signal, outside the pixel. Presently, the classical image sensors can be used to obtain such double linear response image by capturing two images with different sensitivity and combining them.

Document U.S. Pat. No. 5,164,832 discloses a CCD-circuit having a response curve that has two sensitivity ranges. The CCD circuit has a clipping gate that is in a parallel configuration on the CCD. In order to obtain a response curve, the light integration period is split into a first and second integration periods. During the first integration period, the clipping gate is set to a specific DC voltage that removes the signals being generated by a high light intensity impinging on the CCD. During the second integration period, this limitation is removed. The high signals will only add to the result during the second period only, low signals will add all the time.

The collected photocharge during the first period of the integration time is limited, during the second period, the limitation is removed. This limitation that can be removed is obtained with a clipping gate that is set to one DC voltage during the first period, and to another during the second period. This said gate continuously removes charge that is in excess.

AIMS OF THE INVENTION

The present invention aims to disclose an active or passive pixel structure such that with one single pixel, a double or multiple linear, voltage-to-light response can be obtained.

The present invention further aims to disclose a method of reading out an active or passive pixel structure such that a double or multiple linear voltage-to-light response can be obtained in one single image scan.

MAIN CHARACTERISTICS OF THE PRESENT INVENTION

The present invention is related to a method for obtaining a read-out signal of a MOS-based pixel structure having at least a photosensitive element with an output node and a memory element with a first switch therebetween. The method comprises the steps of while acquiring charge carriers on said output node of said photosensitive element, said charge carriers being converted from electromagnetic radiation on the photosensitive element, after a first time period creating a first signal, and after a second time period, creating a second signal, said read-out signal being a combination of at least said first and said second signals.

According to the present invention, there is no limitation to the amount of collected charges in none of the integrated periods. The signal collected during the first period is memorized by a switch which shortly closes and opens between the period. During the second period, there is no electrical contact between the output node and the memory element. The switch can thus be in the same state in both period of time. After a second period, there are thus two charge packets, each obtained during a different time. In order to read-out, these two charge packets are then combined into the read-out signal. This combination is done, e.g., by adding or subtracting this charge packets or by adding or subtracting them in the circuitry external to the sensor.

The method is more particularly performed by the following sequence:

after a first time period, said first switch is opened thereby storing a first number of said charge carriers on said memory element and creating a first signal;

and after a second time period, a second number of said charge carriers is stored on said output node creating a second signal, said read-out signal being a combination of at least said first and said second signals.

It should be understood that the terms "creating" and "combining" mean treating the different signals in the electronic circuitry according to the basic knowledge of the person skilled in the art.

The photosensitive element can be any element such as a photodiode, a photogate, a phototransistor or a photoresistor.

The above-mentioned steps and/or concept can be repeated for a number of time periods being larger than 2.

According to a preferred embodiment, the method further comprises the steps:

after said second time period, creating a first intermediate signal from said first signal, thereafter opening and closing said first switch thereby creating a second intermediate signal, and;

combining at least said first and said second intermediate signals in order to obtain said read-out signal.

Preferably, essentially all the charge carriers being converted from electromagnetic radiation impinging on said photosensitive element during said first time period are creating said first signal, except for the normal saturation or anti-blooming of the pixel.

More preferably, essentially all the charge carriers being converted from electromagnetic radiation impinging on said photosensitive element during said second time period are creating said second signal.

According to a first preferred embodiment, the read-out signal is an average or a weighed average of at least said first and said second signals.

According to another preferred embodiment, the read-out signal is a subtraction of said second signal and said first signal.

According to a preferred embodiment, a correlated double-sampling is performed using an extra-step of closing a second switch which is placed in series with the photosensitive element in order to have a reset of said photosensitive element and thereby creating a third signal, said read-out signal being a combination of first, second and third signals.

Preferably, in this case the read-out signal is a combination of the subtraction of third and first signals and subtraction of third and second signals.

According to another preferred embodiment, the read-out signal can be a combination of the subtraction of second and first signals and subtraction of third and second signals.

According to another preferred embodiment of the present invention, the read-out signal can be a combination of the subtraction of second and first signals and subtraction of third and first signals.

The present invention is also related to a MOS or CMOS based pixel structure comprising at least:

a photosensitive element for converting electromagnetic radiation into charge carriers and being connected to a reset switch and to a supply voltage;

a memory element being connected to an amplifier, and a first switch in-between said photosensitive element and said memory element, said first switch being opened causing a first number of said charge carriers being stored on said memory element.

The memory element is preferably an analog memory element such as a capacitor and the switches present in the pixel structure as well as the memory element are preferably MOS transistors. The capacitor can be in fact a parasitic capacitor being formed by the interconnect lines in the pixel.

The present invention is also related to a CMOS image device having a geometric configuration of pixel, at least part of the pixels having the structure described hereabove.

DESCRIPTION OF PREFERRED EMBODIMENTS OF THE PRESENT INVENTION

Figure 1A:
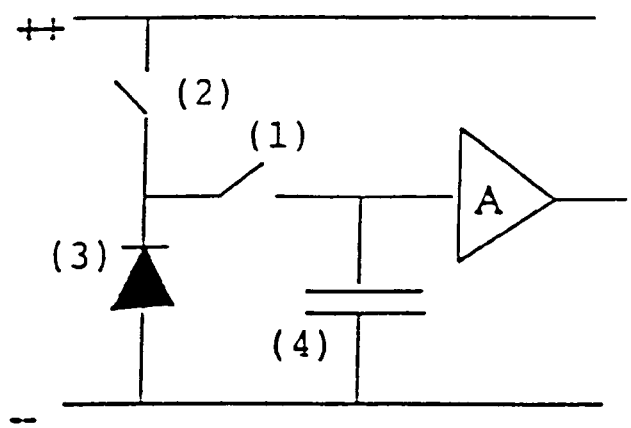
FIGS. 1a and 1b show a schematic functional representation of the pixel structure according to embodiments of the present invention.
Figure 1B:
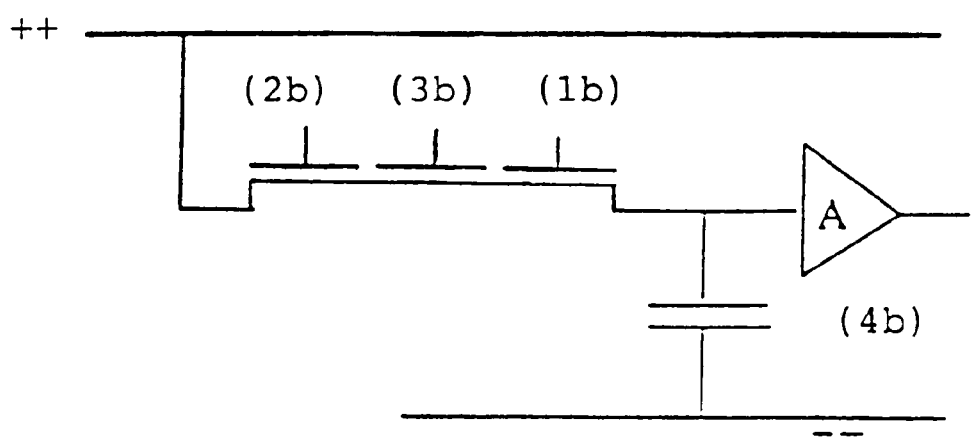

FIG. 1a represents a functional pixel structure according to an embodiment of the invention wherein a memory element (4) is provided. In this FIG. 1, (3) is a photosensitive element such as a photoreceptor or photodiode, which can be reset by a switch (2). The signal generated by the photodiode can be periodically sampled by another switch (1) on a capacitor (4). The resulting voltage can then be multiplexed in a classical way over circuitry represented by the amplifier A. FIG. 1b depicts alternative embodiments with reference numerals (with a "b" subreference) tracking reference numerals of FIG. 1a referencing corresponding elements. The discussion of FIG. 1a applies to FIG. 1b.

According to one preferred embodiment, such amplifier A is placed within the pixel structure in order to have an active pixel. According to another preferred embodiment, the amplifier A can be placed outside of the pixel structure in order to have a passive pixel structure.

This pixel structure is able to perform the method of the invention for obtaining a read-out signal as described and therefore is able to realize a double or multiple linear light-to-voltage response in one single pixel.

Figure 2A:
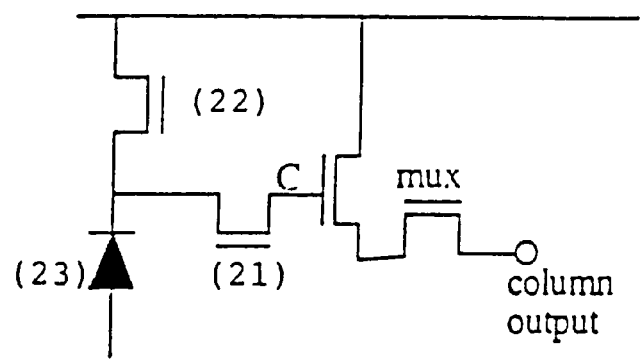
FIGS. 2a and 2b represent the architecture of a pixel according to specific embodiments of the present invention.
Figure 2B:
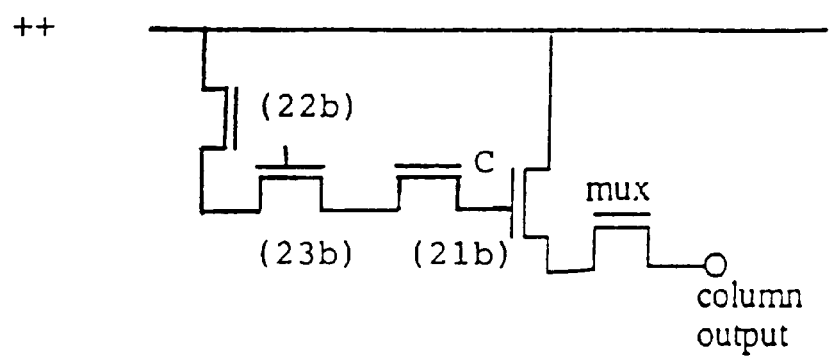

FIG. 2a represents a specific embodiment of the schematic structure as represented in FIG. 1. The pixel therein is a 4T (transistor) integrating active pixel. It has the feature of being able to sample through switch (21) a signal level intermediate in the integration slope, on the node C. Afterwards, both signals (the intermediate value and the final integrated value) can be combined in one read-out signal with high dynamic. In the simplest approach, this combination consists of adding both values. FIG. 2b depicts alternative embodiments with like reference numerals (with a "b" subreference) referencing corresponding elements. The discussion of FIG. 2a applies to FIG. 2b.

Figure 3A:
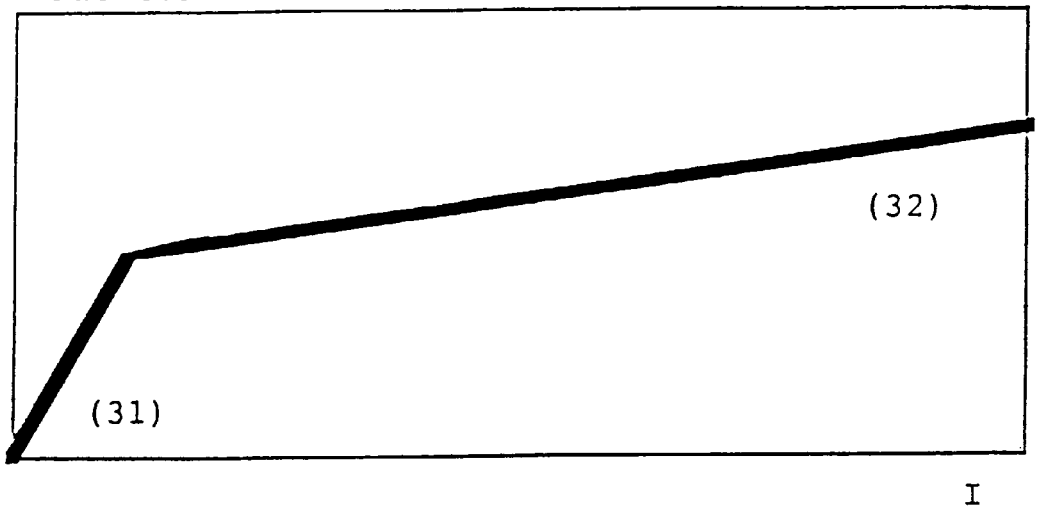
FIG. 3a represents a typical response of the pixel of FIG. 2.
Figure 3B:
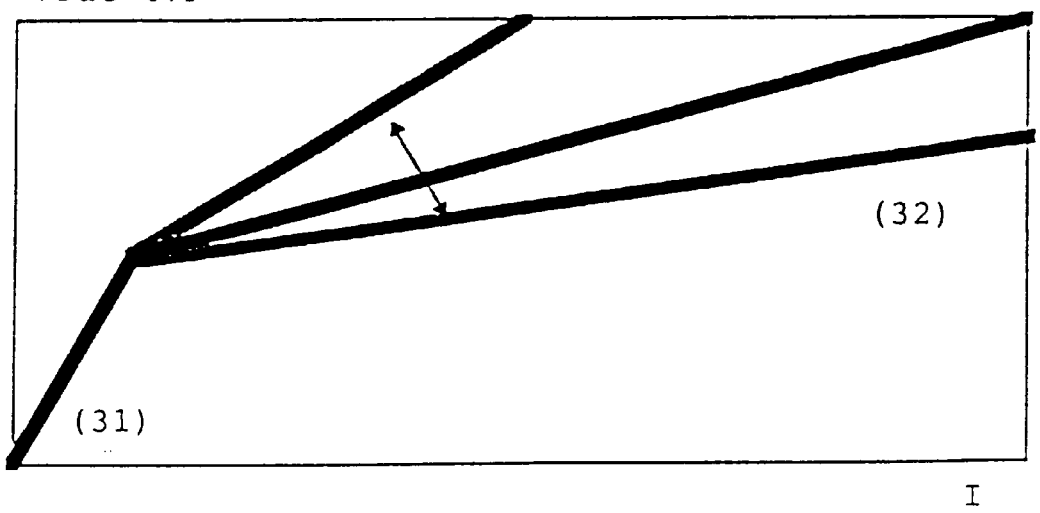
FIG. 3b represents the different possibilities for the slope of the response varying by the electronic shutter ratio.

The effective response of such a structure is represented in FIG. 3a for an active pixel with a double linear slope having a first (32) and a second (31) part. According to the present invention and as represented in FIG. 3b, the slope of the first part (32) can be varied by the electronic shutter ratio according to the number of rows in the image. For instance, between a factor of 1 to 250.

The double slope compresses the high intensity part of an image, but preserves the low intensity part. It has a comparable property as the gamma correction or as the logarithmic compression, yet it can be tuned within a wide range to accommodate various light intensity conditions.

Figure 2B:
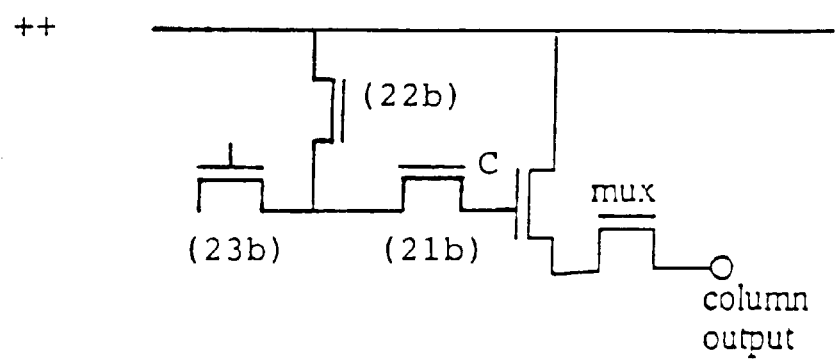
Figure 4:
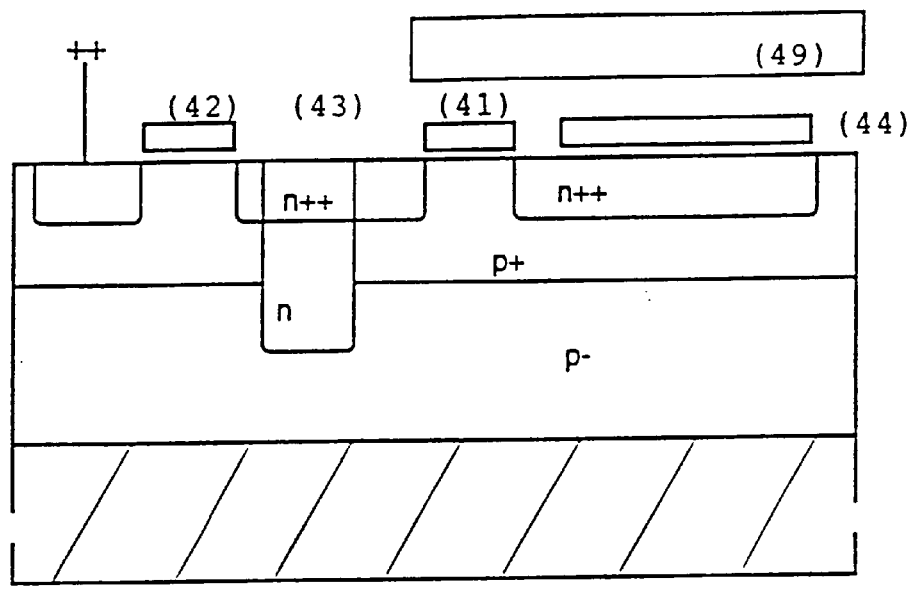
FIG. 4 represents a possible embodiment of the pixel structure according to the present invention.

A cross-section of a possible implementation in a CMOS technology of a pixel structure as represented in FIG. 1 or 2 is shown in FIG. 4 wherein the memory element is also realized as a MOS structure (44) (although it is not necessary to do so); the amplification and multiplexing beyond are not shown. The metal light shield (49) is not necessary, as the operation of the pixel structure tolerates some charge collection. Further shown in FIG. 4 is a silicon substrate wherein a photosensitive element (43) as a $(n^{++})n/p-$ junction; a first switch (41) and a second switch (42) as metal or polysilicon layers separated from the silicon substrate (in fact from the $p^+$ surface layer) by a dielectric layer.

The analog memory element is represented by the capacitor component (44) which has a part or parts which are junctions, or which has connections to other circuit elements (in casu transistors) which have junctions. Junctions are light sensitive, and this light sensitivity will cause a current flow which will affect the charge stored on the capacitor (44). Such memory element or capacitor (44) can be used for various purposes: spatial and temporal filtering, the memorization of image, etc.

The above circuit should, in order to operate in the best mode, have a stable signal on capacitor (44). Hereto, the capacitor and also the interconnections to it should be shielded from the light, which is straightforward by using a metallization. However, the capacitor and/or interconnection elements to it may also collect charge that is present in the chip's substrate due to light falling on it. Especially, photo charge that is being created deep in the substrate can diffuse easily onto capacitor (44) or its interconnections, and (dis-) charge them.

If the photo diode (43) or another diode, not part of the capacitor (44) is made according to the embodiment of FIG. 4, the wandering charge in the substrate of the chip will likely be collected there, and will thus not affect the charge on the capacitor (44).

The present invention is also related to preferred methods of reading the signal of a CMOS based pixel structure in order to obtain a double or multiple linear slope for a dynamic response. According to the first preferred embodiment, as represented in FIG. 5, several pulses can be applied to the reset (22) and to the switch (21) of the pixel structure of FIG. 2.

Figure 5:
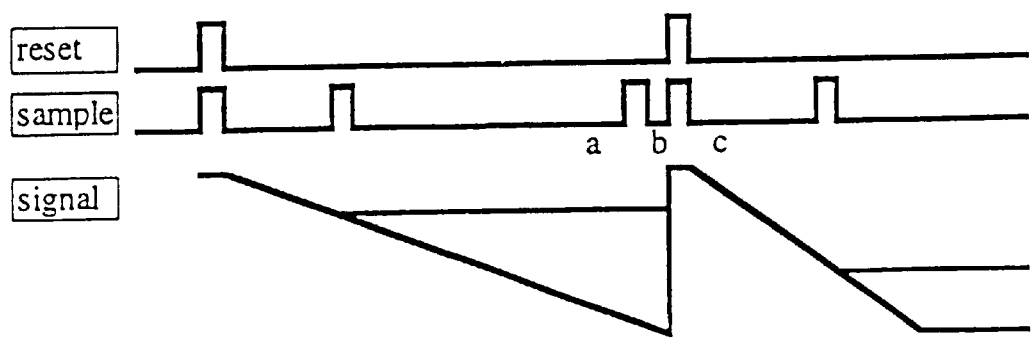
FIG. 5 represents a method of driving and reading the pixel.

On FIG. 5, the reset is represented on the first line, the sample on the second and the potential level seen on the photodiode output node and on the node C on the third line.

Two integration periods are shown on FIG. 5. A certain time after the reset pulse, the switch (21) is opened for a short while, thus freezing this potential on the node (capacitor) C. At the end of the first integration period, the switch (21) is shortly opened, and the recent potential on the photodiode output node is sampled.

In the present embodiment, a weighted average of the recent potential on the photodiode output node and of the potential that was frozen on the capacitor C is sampled (signal "b"). After reset (closing of switch 22), the reset level of the pixel is sampled again (signal "c") which might be useful for offset correction, correlated double sampling etc. This signal sample ("b") is sufficient to obtain a double linear response, as this sample is in itself the average of the potential on capacitor C and on the photodiode, which are the electrical responses with low and high sensitivity themselves. Difference (b-c) is a correlated double sampled version of this signal thus removing eventual offset nonuniformity.

In a more general teaching and without reference to the pixel structure of FIG. 2, in FIG. 5, the method of the invention is schematically shown.

On FIG. 5, the reset is represented on the first line, the sample on the second and the potential level seen on the photodiode output node and on the node C on the third line. A certain time after the reset pulse, the sample is opened for a short while, thus freezing this potential on capacitor C.

At the end of the integration period, the memorized value on the capacitor C is sampled ("a"), then the sample switch is shortly opened, and the recent potential on the photodiode output node is sampled ("b"). After reset, the reset value of the pixel is sampled, which might be useful for offset correction, correlated double sampling etc.

Values a and b, or in a correlated double sampling configuration, (c-a) and (c-b) are the responses with low and high responsivity respectively. Both values can be combined externally to the pixel, inside or outside the image sensor. The simple way of combination is a linear combination, yielding effective response curves as shown in FIG. 3.

Values a and b, or in a correlated double sampling configuration (c-a) and (c-b) are the responses with low and high responsivity respectively. Both values can be combined externally to the pixel, inside or outside to the image sensor. A simple way of combination is a linear or even non linear combination, yielding an effective response curve as shown in FIG. 3a.

In an embodiment of the present invention, a pixel structure is made in a 0.7 $\mu$m CMOS technology and fabricated at MITEC. The pixel of the invention shows a dynamic range of about 1:20000 to 1:60000 whereas a reference pixel without the characteristics of the invention and fabricated in the same technology shows a dynamic range of about 1:2000 to 1:3000.

What is claimed is:

1. A method for obtaining a read-out signal of a MOS-based pixel structure having in a MOS technology at least a photosensitive element with an output node and a memory element with a first switch therebetween, the method comprising the steps of while acquiring charge carriers on said output node of said photosensitive element, said charge carriers being converted from radiation impinging on the photosensitive element:

after a first time period opening said first switch thereby storing a first number of charge carriers on said memory element and creating a first signal;

after a second time period, creating a second signal from a second number of said charge carriers being stored on said output node of said photosensitive element, and combining at least said first and said second signals in order to obtain said read-out signal.

2. The method as recited in claim 1, wherein said steps are repeated for a number of time periods being larger than 2.

3. The method as recited in claim 1, further comprising the steps of:

after said second time period, creating a first intermediate signal from said first signal, thereafter opening and closing said first switch thereby creating a second intermediate signal; and combining at least said first and said second intermediate signals in order to obtain said read-out signal.

4. The method of claim 1, wherein all the voltages applied on said pixel structure are the same during the first and second time periods.

5. The method as recited in claim 3, wherein the read-out signal is a weighed average of at least said first and said second intermediate signals.

6. The method as recited in claim 3, wherein the read-out signal is a linear combination of said second and said first intermediate signals.

7. The method as recited in claim 3, wherein a correlated double-sampling is performed using an extra-step of closing a reset switch which is placed in series with the photosensitive element in order to have a reset of said photosensitive element and thereby creating a third signal, said read-out signal being a combination of said first, second and third signals.

8. The method as recited in claim 7, wherein the read-out signal is a combination of the subtraction of third and first signals and of the subtraction of third and second signals.

9. The method as recited in claim 7, wherein the read-out signal is a combination of the subtraction of second and first signals and of the subtraction of third and second signals.

10. The method as recited in claim 7, wherein the read-out signal is a combination of the subtraction of second and first signals and of the subtraction of third and first signals.

11. Use of the method recited in claim 1 in a camera system.

12. A MOS-based pixel structure, comprising at least:
   a photosensitive element for converting radiation into charge carriers, and being connected to a voltage with a reset switch;
   a memory element being connected to an amplifier; and
   a first switch in-between said photosensitive element and said memory element, said first switch being opened causing a first number of said charge carriers being stored on said memory element.

13. A MOS-based pixel structure according to claim 12, wherein the memory element is an analog memory such as a capacitor or a parasitic capacitor.

14. A MOS-based pixel structure according to claim 12, wherein both switches are CMOS transistors.

15. A MOS-based pixel structure according to claim 12, wherein said amplifier is placed within the pixel structure in order to have an active pixel.

16. A MOS-based pixel structure according to claim 13, wherein said amplifier is placed within the pixel structure in order to have an active pixel.

17. A MOS-based pixel structure according to claim 14, wherein said amplifier is placed within the pixel structure in order to have an active pixel.

18. A MOS-based pixel structure according to claim 12, wherein said amplifier is placed outside of the pixel structure in order to have a passive pixel structure.

19. A MOS-based pixel structure according to claim 13, wherein said amplifier is placed outside of the pixel structure in order to have a passive pixel structure.

20. A MOS-based pixel structure according to claim 14, wherein said amplifier is placed outside of the pixel structure in order to have a passive pixel structure.

21. A MOS image sensor having a geometric configuration of pixels consisting in a structure according to claim 13.

22. A MOS image sensor having a geometric configuration of pixels consisting in a structure according to claim 14.

23. A MOS image sensor having a geometric configuration of pixels consisting in a structure according to claim 15.

24. A MOS image sensor having a geometric configuration of pixels consisting in a structure according to claim 16.

25. A MOS image sensor having a geometric configuration of pixels consisting in a structure according to claim 17.

26. A MOS image sensor having a geometric configuration of pixels consisting in a structure according to claim 18.

27. A MOS image sensor having a geometric configuration of pixels consisting in a structure according to claim 19.

28. A MOS image sensor having a geometric configuration of pixels consisting in a structure according to claim 20.

29. Use of the MOS image sensor as recited in claim 21 in a camera system.

30. Use of the MOS image sensor as recited in claim 22 in a camera system.

31. Use of the MOS image sensor as recited in claim 23 in a camera system.

32. Use of the MOS image sensor as recited in claim 24 in a camera system.

33. Use of the MOS image sensor as recited in claim 25 in a camera system.

34. Use of the MOS image sensor as recited in claim 26 in a camera system.

35. Use of the MOS image sensor as recited in claim 27 in a camera system.

36. Use of the MOS image sensor as recited in claim 28 in a camera system.

* * * * *